(12) United States Patent
Joseph et al.

(10) Patent No.: US 6,678,182 B2
(45) Date of Patent: Jan. 13, 2004

(54) ELECTRICAL BUS WITH ASSOCIATED POROUS METAL HEAT SINK AND METHOD OF MANUFACTURING SAME

(75) Inventors: Craig Joseph, Santa Clara, CA (US); Kelly W. Arnold, Santa Clara, CA (US); T. James Dorsch, Los Gatos, CA (US); Anthony C. Evans, Hollister, CA (US)

(73) Assignee: United Defense LP, Arlington, VA (US)

( * ) Notice: Subject to any disclaimer, the term of this patent is extended or adjusted under 35 U.S.C. 154(b) by 0 days.

(21) Appl. No.: 10/382,271

(22) Filed: Mar. 4, 2003

(65) Prior Publication Data

US 2003/0179596 A1 Sep. 25, 2003

Related U.S. Application Data

(63) Continuation-in-part of application No. 09/708,182, filed on Nov. 7, 2000, now Pat. No. 6,529,394.

(51) Int. Cl.[7] .................................................. H02M 1/10
(52) U.S. Cl. ........................ 363/141; 361/145; 361/147; 361/689; 361/69
(58) Field of Search ................................ 363/141, 145, 363/147, 689, 69, 699, 704

(56) References Cited

U.S. PATENT DOCUMENTS

| | | | | | |
|---|---|---|---|---|---|
| 4,748,495 | A | * | 5/1988 | Kucharek | 257/713 |
| 5,184,291 | A | * | 2/1993 | Crowe et al. | 363/37 |
| 5,631,821 | A | * | 5/1997 | Muso | 363/141 |
| 6,166,937 | A | * | 12/2000 | Yamamura et al. | 363/141 |
| 6,618,278 | B2 | * | 9/2003 | Suzuki et al. | 363/144 |

* cited by examiner

Primary Examiner—Bao Q. Vu
(74) Attorney, Agent, or Firm—The Kline Law Firm

(57) ABSTRACT

A module is formed in which semiconductor components are soldered to an electrically conductive heat sink. The electrically conductive heat sink is formed so that it will serve as an electrical bus in an electronic device. The chips of the semiconductor component are metallurgically bonded to the surface of the heat sink. The heat sink uses a heat transfer fluid that flows through an interior of the heat sink, the interior containing an internal element. In the preferred embodiment, the internal element is a plurality of silver plated copper balls. The copper balls are brazed to each other and to the walls of the heat sinks in an assembly process. The heat sink housing will typically be made from copper, with one surface made from molybdenum so that the expansion and contraction of the heat sink housing molybdenum surface will be similar to that of the silicon substrate of the chips, thereby avoiding the problem of the chip substrate cracking and breaking due to thermal flexing.

23 Claims, 8 Drawing Sheets

ELECTRICAL BUS WITH ASSOCIATED POROUS METAL HEAT SINK AND METHOD OF MANUFACTURING SAME

This application is a continuation-in-part of the inventors' application Ser. No. 09/708,182, filed Nov. 7, 2000, now U.S. Pat. No. 6,529,394, which is hereby incorporated by reference in its entirety.

FIELD OF THE INVENTION

The present invention relates generally to an electrical bus with a means for dissipating heat from semiconductor components, and more particularly is a module comprising an electrically conductive porous metal heat sink that has semiconductor components attached to a surface thereof, the semiconductor components being directly and metallurgically attached via soldering to the heat sink. The invention also includes the method of manufacturing a porous metal heat sink for an electronic device.

BACKGROUND OF THE INVENTION

Many electronic components generate heat during operation. This characteristic becomes significant in instances in which an electronic device is used to generate, transfer, or convert electric power. An excellent example of this effect, cited in Applicants' related application (referenced above), is the inverter used in electric traction motors. Heavy electric vehicles, including locomotives, road and off-road vehicles, are driven by electrically powered traction motors which turn the wheels or tracks of the vehicle. These traction motors operate on AC power, but the electrical power supplied by the energy source of the vehicle is typically DC. This DC power must therefore be converted to AC power in an inverter. Further, the rotational speed of such traction motors is usually controlled by means of the frequency of the AC power. The electric power generation rectification/inversion/voltage control/frequency control system (hereinafter summarized as power converter) requires the use of multiple semiconductor devices, and integrated circuits to control the semiconductor devices, all of which generate a great deal of heat. Many other electrical applications require the use of semiconductor devices and integrated circuits to control them. They therefore also require some means of dissipating the heat generated.

To dissipate the heat produced in a power converter used in an electric vehicle, current art vehicles use either air-cooling systems or water cooled heat sinks, or both in combination. Similarly, other current art electronics applications require some method of heat dissipation, most often air-cooling. The current art methods of cooling give rise to several problems.

For any device to be air-cooled there must be adequate space around the device for air to flow in sufficient volume to remove the heat. In the specific instance of the power converter for the electric traction motor, since traction motor applications typically utilize three-phase AC power, six power semiconductor switch assemblies and six diodes must be employed. The electrical requirements of the motors require that a capacitor bank be present in the power converter, along with the power semiconductors and their accompanying diodes, sensors, switch driver circuitry, etc. The number of components required therefore mandates a significant space requirement. This space requirement is then further greatly exaggerated by the need for space to accommodate flow of air around the power converter components. This space requirement problem is common to all air-cooled electronic devices.

In direct contradiction to the need for open space for the flow of cooling air is the fact that all electrical devices function best in enclosed, non-ventilated environments. This kind of environment reduces the potential for contaminant buildup. Contaminant buildup can not only impede the desired heat transfer, but may also cause an electrical failure of the device. Therefore air-cooling can directly create a situation detrimental to the function of the electrical device.

Because of the problems caused by air-cooling, some current art devices utilize water-cooling, particularly in high power applications, to provide a more controlled environment. But a water-cooled heat sink system suitable for a power converter is generally not readily available in a vehicle. Thus, utilization of a power converter that is water-cooled leads to the necessity of including a water cooling system in a vehicle that would not otherwise require it. Still more space is therefore required. Moreover, due to the conductive nature of water, it is necessary to dielectrically isolate the power converter components from such a water-cooling system and this, in itself, results in less than satisfactory cooling of the semiconductor switches and diodes.

Further problems created by the use of current art cooling methods, in particular by the size requirements demanded by the current art cooling systems for power converters, are due to the fact that the power converter comprises a large unit contained in a compartment dedicated only to the power converter. This necessitates that lead wires for control and feedback systems must be fairly long, typically anywhere from 2 to 10 feet. Longer wires are by necessity heavier than shorter wires, both in terms of weight and electrical rating. Longer wires significantly increase the potential for distorted signals.

High power electric traction motors suitable for heavy vehicles are usually oil-cooled and such vehicles therefore require an oil-cooling system. Utilizing a dielectric fluid such as oil to cool the power converter allows the heat sink to be an integral part of the circuitry of the power converter. The oil-cooled heat sink can thus serve as an electrical power bus to which heat generating electronic components are directly mounted. The enhanced cooling capability achieved by oil cooling the electrical bus greatly enhances the electrical performance of these electronic components and therefore allows for a very compact, high performance power converter. The same oil-cooling system used to cool the traction motors can be used to cool the power converter. The space requirements are thus considerably less than current art air-cooled and water-cooled systems.

Accordingly, it is an object of the present invention to provide a module in which electronic components are attached to an electrically conductive heat sink in a way that gives rise to significantly reduced space requirements.

It is a further object of the present invention to provide a module in which electronic components are attached to an electrically conductive heat sink in a generally planar assembly, thereby reducing inductance.

It is another object of the present invention to incorporate the electrically conductive heat sink as an active part of the component circuitry.

It is still another object of the present invention to allow the electronic components to be metallurgically bonded to the electrically conductive heat sink.

The requirements of the electrically conductive heat sink, and the objects of the present invention are as follows:

1. The heat sink must comprise a plurality of pathways uniformly distributed throughout so as to allow uniform distribution and passage of the cooling fluid.

2. At least one surface of the heat sink must be made from a thermally and electrically conductive metal that is suitable for metallurgical bonding to the electronic components. Other elements of the heat sink can be constructed from metals offering optimum properties for fabricating an electrically conductive heat sink.

3. There must be a sufficient surface-area-to-volume relationship for the internal pathways to provide for the required convective transfer of heat from the heat sink to the heat exchange fluid.

4. All metallic components of the heat sink must be metallurgically bonded to each other to minimize resistance to conduction of heat and electricity throughout.

5. The bonding surface of the electrically conductive heat sink must be prepared to allow for metallurgical attachment of the electronic components.

SUMMARY OF THE INVENTION

The present invention is a module comprising an electrically conductive heat sink that has semiconductor components attached to the surface thereof, the semiconductor components being directly and metallurgically attached via soldering to one surface of the electrically conductive heat sink, and the method of manufacturing the heat sink with associated electronic components. One example of an electronic device that can be constructed with the module according to the present invention is an oil-cooled inverter for an electric traction motor. Six IGBT switches and twelve diodes are metallurgically attached to each heat sink, which also serves as an electrical bus, and six such modules are used in the assembly of the 3-phase inverter.

In the preferred embodiment of the heat sink of the present invention, a hollow metal housing is fitted with inlet and outlet ports to allow a cooling fluid to flow through the housing. The housing is filled with a plurality of metal balls metallurgically bonded together at the points of contact so as to provide for both conductive heat transfer from one ball to another and a plurality of fluid flow paths through the interstices between the balls. The metal balls serve as conductive paths to transfer heat and to dissipate the heat into the cooling fluid that flows through the open spaces around the balls. Alternative methods of forming the porous metallic conductive interior element of the heat sink include replacing the metal balls with a machined block of a conductive metal such as copper, brass, bronze, silver, or aluminum, or with metal wool, or with metal felt, or with open cell metal foam, or the like.

Because it is intended to mount electronic components directly onto the heat sink, at least one surface of the heat sink, the mounting surface, must be made from a thermally and electrically conductive metal that has a similar coefficient of thermal expansion to that of the electronic components. In the preferred embodiment molybdenum is used for the mounting surface. Other metals and metal alloys can be used provided their coefficient of thermal expansion is within the range of 4.5 to 10 ppm/° K at 23° C. Therefore, forming one surface of the heat sink from molybdenum allows the electronic components to be mounted directly to that surface. Since molybdenum, silicon, silicon carbide, and gallium arsenide have similar coefficients of thermal expansion, the expansion and contraction of the heat sink mounting surface will be similar to that of the substrate of the semiconductor chips. Since both elements, the heat sink mounting surface and the chip substrate, expand and contract a similar amount during heating and cooling, the problems of delamination of the chip from the mounting surface or of the chip substrate cracking and breaking due to thermal flexing when the component heats and cools is eliminated.

In order to be susceptible to receiving soldered components, as is a key element of the present invention, the molybdenum mounting surface of the heat sink must be nickel-plated. Nickel plating of both sides of the mounting surface not only allows silicon chips to be soldered with lead containing or lead-free solders to the external side of the mounting surface, but also provides an improved bonding surface for the brazing process used to attach the porous metallic heat transfer media to the internal side of the mounting surface and to complete the assembly of the heat sink. Electrodeposited nickel plating is sufficient for the external surface on to which the electronic components are to be soldered. However, it has been found by the inventors that an electroless process is optimal to properly nickel plate the interior surfaces of the heat sink housing prior to assembly of the heat sink and concurrent attachment of the porous metallic heat transfer media to the internal surfaces of the heat sink housing by brazing. When an electroless process is used for the interior of the housing, it is a simple matter to extend the process to the exterior of the mounting surface as well.

The electrically conductive heat sink can be assembled from separate components selected for design, manufacturing and performance preferences. Such components can include the controlled thermal expansion mounting surface, a heat sink housing body made from a different material to the mounting surface, end caps or manifolds, and a range of alternate porous metallic internal elements. The use of such separate components readily enables the preferred porous metallic internal element to be assembled inside the electrically conductive heat sink housing and manifold connections for heat transfer fluid ingress and egress to be made. After the porous metallic internal element has been placed in the interior of the heat sink housing and the remaining components of the heat sink assembled, all components of the heat sink are joined by brazing. The joints between the components of the housing have minimal mechanical performance requirements, but do have to seal the unit with a sufficiently strong bond so that pressurized fluid can flow through the heat sink without leaks.

For the preferred embodiment of the present invention, the porous metal heat transfer element is constructed by packing relatively small, uniformly sized balls together in the heat sink housing. It has been found by the inventors that balls having a diameter between 0.05 and 0.15 inch are optimal. The balls must be bonded together and the bond contact area must be sufficiently large to allow for conduction of heat and electricity from ball to ball. The metallurgical bonding between the balls is achieved by plating the balls with sufficient volume of a brazing compound so that during a brazing cycle, a sufficient volume of liquid is produced to allow wetting at contact points between the balls. This process increases the size of the conductive heat transfer paths and minimizes thermal and electrical resistance.

In the preferred embodiment, copper balls are used as the porous metal heat transfer element in order to optimize conductive heat transfer, and because copper has the necessary ductility to allow the manufacture, with currently available technology, of balls of the small size required. However, copper alloys are susceptible to hydrogen embrittlement, so the composition of the balls must be controlled to allow for the necessary thermal processing required during brazing. An OFHC (Oxygen Free High Conductivity) copper alloy is selected. The copper balls are plated with silver and copper-silver eutectic brazing compound is formed on the surface of the balls during thermal processing.

The module of the present invention is constructed so as to form a planar bus device. The generally planar structure of the heat sink assembly and its companion electrical components significantly reduces the inductance of the device. This allows the semiconductor components to function more efficiently.

The module of the present invention can be used with many electronic components without affecting the electrical operation of the component. In any semiconductor a portion of the power passing through the chip is dissipated as heat. This becomes significant at currents greater than 100 amps and results in rapid heating of the semiconductor. This heat must be removed to maintain the junction temperature of the semiconductor at or below an acceptable level. Above this temperature there is rapid degradation and failure of the semiconductor chip. One key difference between the module of the present invention and prior art components is that the semiconductor chip is metallurgically attached to the heat sink, that the heat sink is electrically hot, and that the heat sink assembly is used as part of the circuitry of the electronic device. In current art practice semiconductor chips can be mounted to an electrically insulating but thermally conductive plate or can be mounted directly to an air cooled heat sink. In all cases the means of mounting has greater electrical resistivity and lower thermal conductivity than with the present invention. Metal filled adhesives, greases, and gels are used as interface materials when both electrical and thermal conductivity is sought. Silver filled epoxies used for this purpose typically have an electrical resistivity greater than 150 micro-ohm.cm at 23° C. and a thermal conductivity of less than 10 W/m·K at 23° C. The low thermal conductivity of current art interface materials implies that the rate of heat transfer from the chip is less than with the present invention and hence that the current flowing through the semiconductor must be maintained less in order to maintain a lower level of internal heat dissipation and, hence, an acceptable junction temperature. In those instances where the chips are bonded directly to a heat sink, and particularly at currents greater than 100 amps, $I^2R$ heating will heat the interface. The more resistive current art interface materials will result in greater interface heating than with the present invention and, thus again, result in limitations in allowable current.

One of the chief advantages of the present invention is that it greatly reduces the space required for the electronic components to function efficiently. The heat sink of the present invention accomplishes the same amount of heat transfer as prior art devices having vastly larger size and weight requirements. A traction engine inverter module constructed according to the present invention requires only 10% of the amount of space required by the inverter module of current art devices. The weight of the inverter module of the present invention is also greatly reduced, being only 20% of that of the current art. This tremendous reduction in size and weight leads to the added benefit of making the component far less expensive and more practical to "spare", that is, to stock an entire component module for repair use.

Another advantage of the present invention is that the reduced size and compact assembly of the semiconductor components allows them to be mounted closer to the devices they control or support. This significantly reduces the length of the lead wires required for feedback and control systems.

A still further advantage of the present invention when embodied as an inverter is that it utilizes the same coolant supply system as does the electric motor of the vehicle, thereby eliminating the necessity of a water cooling system.

A still further advantage of the present invention is that it provides a molybdenum surface to which electronic components can be soldered. The chips of the component circuitry are mounted directly on the surface of the heat sink, thereby eliminating components and space requirements. One surface of the heat sink is electrically hot, and serves as part of the circuitry. The direct attachment significantly reduces thermal and electrical resistance between the semiconductor components and the heat sink.

Still another advantage of the present invention is that the planar structure achieved for the module reduces inductance.

These and other objects and advantages of the present invention will become apparent to those skilled in the art in view of the description of the best presently known mode of carrying out the invention as described herein and as illustrated in the drawings.

DETAILED DESCRIPTION OF THE INVENTION

Figure 1:
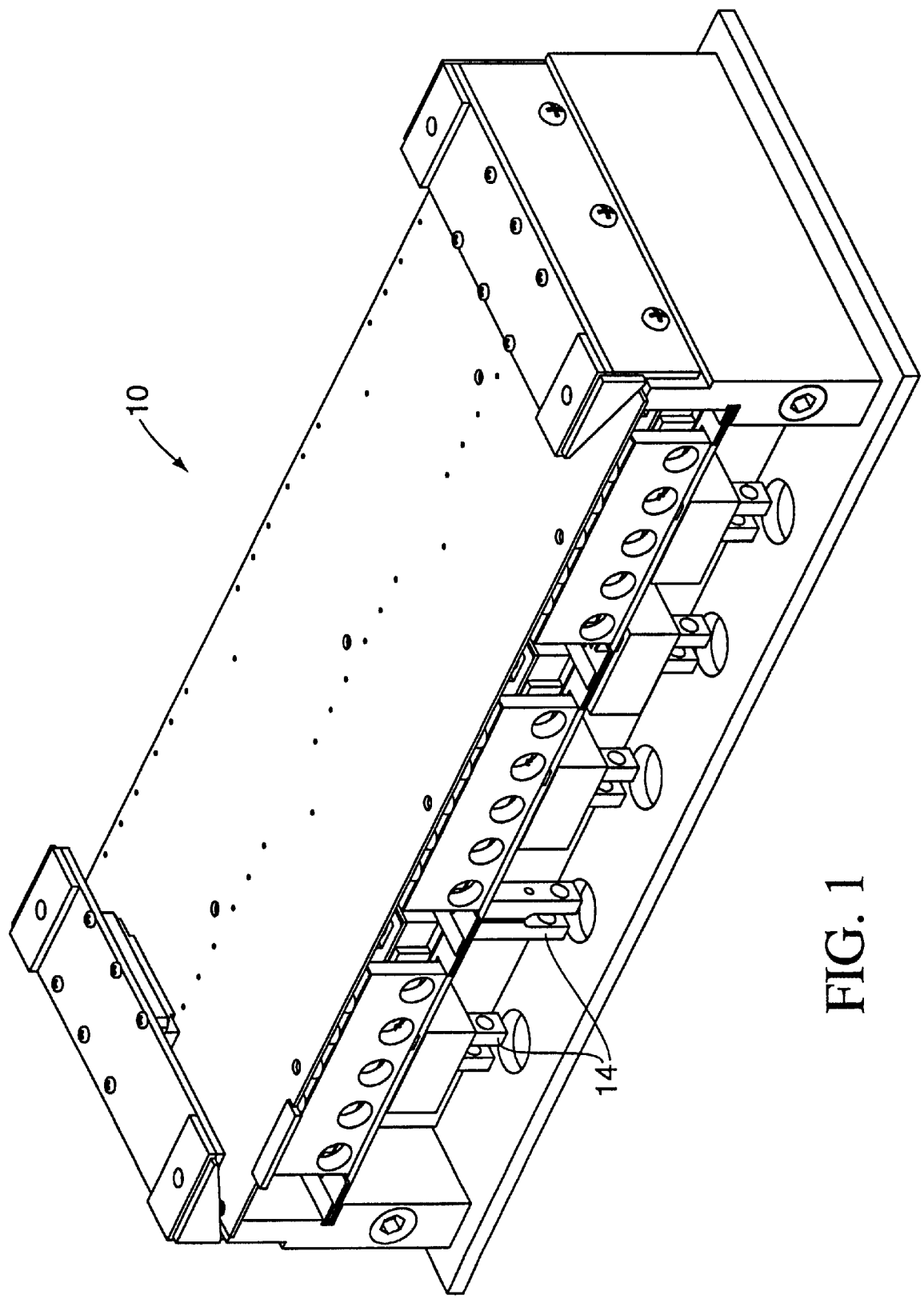
FIG. 1 is a top side perspective view of an inverter module assembled with IGBT modules and constructed according to the present invention.

The present invention is a construction of a module that comprises an electrically conductive heat sink that functions as an active element of an electrical circuit of semiconductor components that are metallurgically attached to the heat sink. The heat sink serves as an electrical bus. While the direct attachment of semiconductor components to, and the active function of, the module is of great benefit in a number of applications, particularly those that generate and/or transfer power, one specific example of an electronic device that can be constructed utilizing the module of the present invention is an oil-cooled inverter for an electric traction motor. Six IGBT switches and twelve diodes are metallurgically attached via soldering to each heat sink, which also serves as an electrical bus, and six such modules are used in the assembly of the 3-phase inverter.

Referring first to FIGS. 1–4, one embodiment of the present invention is as a module comprising semiconductors attached to a cooled electrical bus assembled into an inverter 10 for an electric traction motor. The inverter 10 uses oil as a heat transfer fluid. The inverter 10 is installed in line with the oil-cooling system of the motor of the vehicle, so that no additional cooling system is required. Because of its compact design, the inverter 10 can be mounted directly to the motor of the vehicle.

It can be seen that the inverter 10 comprises an external housing 12 that encloses the components of the inverter 10. The current output generated by the inverter 10 is accessed at multiple output terminals which protrude from the inverter body, and are connected to the output brackets 14 of the inverter 10. The current output by the inverter 10 serves as the power source to drive the traction wheels of the vehicle.

The heat transfer fluid, cooling oil from the motor of the vehicle, enters the inverter 10 through a coolant inlet port, and exits via a coolant outlet port. The oil flows through the heat sinks 16, which each have an IGBT switch assembly 18 mounted on a top surface thereof. Each IGBT switch assembly comprises six IGBT's and 12 fly-back diodes. The IGBT switch assembly 18 metallurgically attached to the heat sink 16 is the module of the present invention. There are six such IGBT switch assembly 18/heat sink 16 modules that are utilized in the inverter 10. The six IGBT modules are necessary to enable the inverter 10 to provide 3-phase AC current as its output. A capacitor bank 20 is included in the inverter to provide a storage mechanism that provides a pulsing means for the inverter 10. The capacitor bank 20 comprises a plurality of capacitors fixed side by side.

The IGBT switch assembly 18/heat sink 16 modules and the capacitor bank 20 are mounted on a laminated bus device 22. The bus device 22 comprises a planar central body 221 secured between two end plates 222. The six IGBT switch assembly 18/heat sink 16 modules are mounted on an upper surface of the central body 221 of the bus device 22. The capacitor bank 20 is mounted on a lower surface of the central body 221 of the bus 22.

The central body 221 serves as a mounting means for the plurality of output brackets 14. The output brackets 14 are simply heavy, electrically conductive elements that serve to convey the current produced from the inverter 10 to the output terminals. Lead wires from the traction wheels of the vehicle are then affixed to the output terminals.

On the upper surface of the bus 22, a contact bar extending upward from a first side of the central body 221 comprises an upper portion of a positive bus 223. The positive bus 223 also extends downward from the central body 301 to provide a contact area for the capacitor bank 20. A plurality of raised contact bars extending upward from the front side of the central body 221 comprise a negative bus 224. A plurality of raised contact bars in a center portion of the central body 221 comprise an output connecter bus 225.

The raised portions of bus strips 223, 224, 225 form a pair of longitudinal mounting channels. Each of the mounting channels is used to securely mount three IGBT switch assembly 18/heat sink 16 modules, so that the six IGBT switch assembly 18/heat sink 16 modules are aligned in two rows. The positive bus 223 and the output connecter bus 225 form a first channel 226 that contains a first row of three IGBT switch assembly 18/heat sink 16 modules. The negative bus 224 and the output connecter bus 225 form a second channel 227 that contains a second row with the three remaining IGBT switch assembly 18/heat sink 16 modules. The first row of the IGBT switch assemblies activates the positive segment, in 120° intervals, of the AC current generated. The second row of IGBT switch assemblies activates the negative segment, also in 120° intervals, of the AC current. It should be noted that the structure of the bus device 22 allows the IGBT switch assembly 18/heat sink 16 modules and the capacitor bank 20 to be assembled as generally flat, planar elements. This construction reduces the inductance present in the inverter 10, thereby allowing the IGBT switch assemblies 18 to operate more rapidly, which improves the overall performance of the inverter 10.

The IGBT switch assemblies 18 are affixed to the surface of the heat sink 16 by a process using a metallic material that melts to flow across and wet adjoining surfaces of the semiconductors of the IGBT switch assembly 18 and the heat sink 16. One method that accomplishes the desired result is soldering. The direct attachment of the chips to the heat sink significantly reduces the thermal and electrical resistance of the interface, thereby enabling the inverter system to handle more current (as compared to current art devices) without overheating the switches. Development of the present invention has shown that the interface thus formed has a volume electrical resistivity less than 50 micro-ohm cm and thermal conductivity greater than 10 W/m·° K at 23° C.

In terms of electrical operation, an electronic component constructed according to the present invention is in most ways electrically equivalent to prior art components. One key exception is that the upper surface formed by the bank of heat sinks is electrically hot, and is used as part of the circuitry. This allows the elimination of the insulating plate on which the component circuitry is normally mounted, as the chips of the circuitry of the present invention are mounted directly on the upper surface of the heat sinks.

The inverter described herein as an example embodiment of the present invention uses as its input a 600 volt DC potential generated by the power source of the vehicle in which it is installed. The output of the inverter is 600 amp AC current. The IGBT switch assemblies 18 are mounted directly on an upper surface of the heat sinks 16. Each of the heat sinks 16 is electrically hot, and serves as part of the inverter circuitry. In the preferred embodiment, the upper surface of the heat sink is formed from nickel plated molybdenum, which has a similar coefficient of thermal expansion as silicon. This means that the silicon substrate of the chips of the inverter circuitry will expand and contract a similar amount as the heat sink housing as the inverter heats and cools. The remaining surfaces of the heat sink housing 161 are typically formed from copper.

Figure 5:
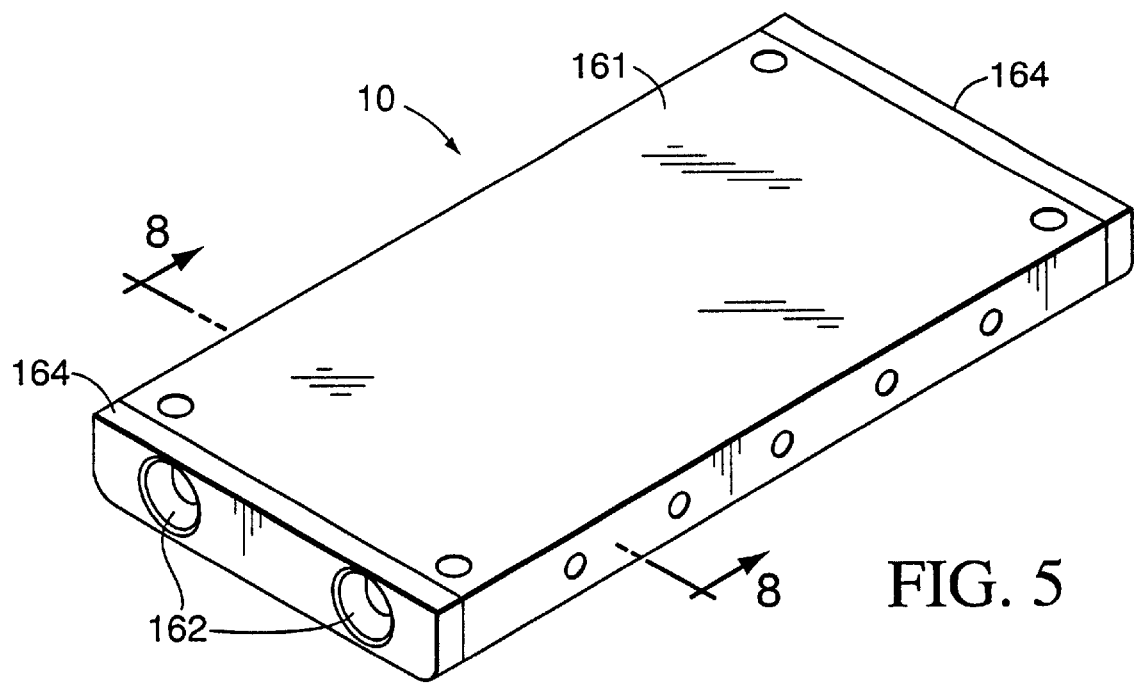
FIG. 5 is a perspective view of a heat sink element of the present invention.
Figure 6:
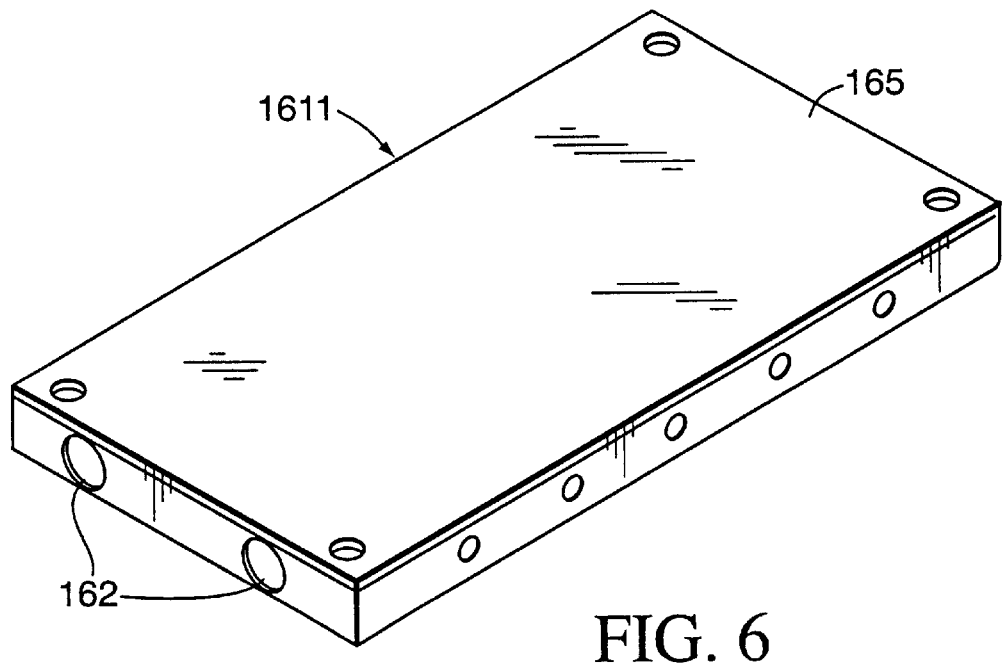
FIG. 6 is a perspective view of an alternate embodiment of the heat sink housing.
Figure 7:
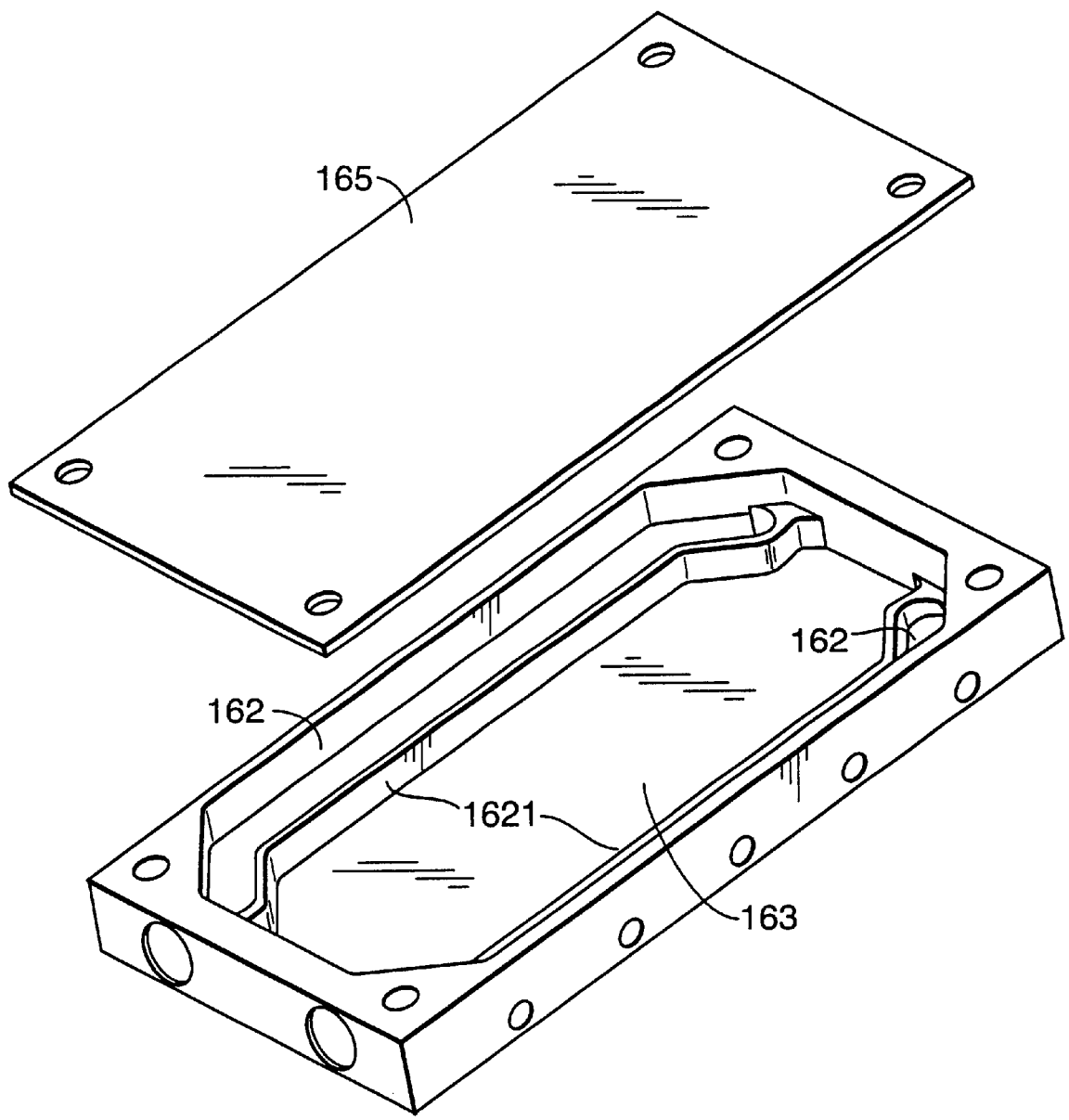
FIG. 7 is a perspective view of an alternate embodiment of the heat sink housing with the top surface removed to show the interior construction.
Figure 8:
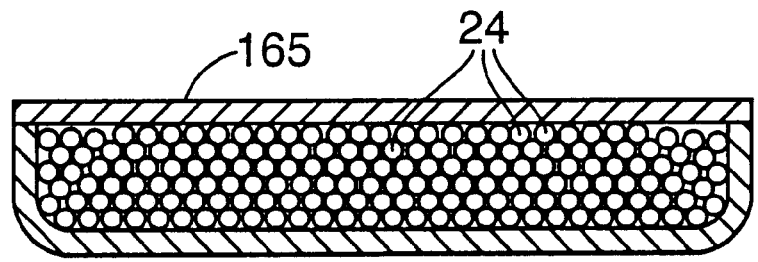
FIG. 8 is a sectional view taken along line 8—8 in FIG. 5.

Referring now chiefly to FIGS. 5–7, the heat sinks 16 include a pair of coolant throughways 162 in their interiors. The throughways 162 each include an open section on an upper inner side thereof formed by a lower inner wall 1621. The open section allows a heat transfer fluid flowing into a first throughway 162 to spill over into the interior of the housing 161, and engulf the heat transfer medium therein. The heat transfer fluid fills the interior of the heat sink 16, and flows into the open section of a second throughway 162, and then out of the heat sink 16.

FIG. 5 illustrates a preferred embodiment for the heat sink housing 161. The housing comprises a central main body with an open interior 163. After a heat transfer medium 24 is placed in the open interior 163 of the central body of the housing 161, the housing 161 is sealed by a pair of end manifolds 164. The end manifolds 164 are secured by using sheets of brazing material to minimize any added electrical resistance.

FIGS. 6 and 7 illustrate an alternate embodiment of the heat sink housing 161'. In the housing 161', the throughways 162 are retained, but the upper surface 165 is separate from the main body of the housing 161' to allow insertion of the heat transfer medium 24. It is envisioned that the upper surface 165 will be the mounting surface for the semiconductor components and will therefore be formed from molybdenum. After the heat transfer medium 24 is inserted into the open interior 163, the housing 161' is sealed by attaching the upper surface 165, again by using sheets of brazing material.

The heat transfer fluid enters the inverter 10 from the coolant supply port through an upper supply side inlet port (throughway opening) on the heat sink 16 of the first in line IGBT switch assembly 18/heat sink 16 modules of each of the two rows of assemblies. The second supply side inlet port (throughway opening) of the first in line heat sinks are capped. The throughways 162 of the first in line heat sinks are connected to the throughways 162 of the second in line heat sinks, which are in turn connected to the throughways of the third in line heat sinks. The connections of the throughways are accomplished by using known rubber connectors. On the outlet end of the inverter 10, the lower throughway openings of the third in line heat sinks are open, and the upper openings are capped.

The heat transfer fluid thus enters each row of heat sinks from an upper inlet side, flows through the row, and flows out of the third in line heat sinks at a lower outlet side. As the heat transfer fluid flows through and around the heat transfer medium 24, heat conveyed into the heat transfer medium 24 from the IGBT switch assemblies 18 is removed by the heat transfer fluid.

In the preferred embodiment, the heat transfer fluid is cooling oil for the electric motor, and the heat transfer medium 24 is a plurality of silver plated copper balls. The copper balls 24 are brazed to each other and to the walls of the heat sinks 16 in a unique assembly process. The spherical shape of the balls provides an excellent means of creating contact from each ball 24 with a plurality of other balls 24 and with the interior walls of the heat sink housing 161. This creates a superior heat transfer path in the heat sinks 16. The flow paths created between the balls 24 have smooth boundaries and are relatively large. Free flow through the heat transfer medium is critical so that debris from the motor oil does not become trapped in the interior of the housing 161.

Referring now chiefly to FIGS. 5–11, the heat sinks 16 of the present invention are formed as follows: The device envisioned for use with the present invention require a heat sink 16 with a porous metallic internal element 24 that serves as a heat transfer element. The heat transfer element 24 allows fluid flow through passageways therein. In the preferred embodiment, the porous heat transfer internal element 24 is formed from a large plurality of metal balls bonded together to provide a plurality of fluid flow paths. The flow paths through the internal element 24 serve as conductive paths to transfer heat from the mounting surface 165, and to dissipate the heat into the cooling fluid that flows through the interstices around the balls 24. Thus the metal balls of the internal element 24 must be in thermally conductive contact with each other. The metal balls are metallurgically bonded together at the points of contact so as to provide for both conductive heat transfer from one ball to another and a plurality of fluid flow paths through the interstices between the balls for convective heat transfer into the cooling fluid.

It is preferred that at least one surface of the heat sink housing 161 is formed from molybdenum. Molybdenum has a coefficient of thermal expansion similar to that of silicon, silicon carbide, and gallium arsenide. Therefore, forming at least one surface of the heat sink from molybdenum allows the semiconductor components of the electronic device to be mounted directly on the molybdenum surface of the heat sink 16. The molybdenum mounting surface 165 of heat sink 16 has a coefficient of thermal expansion similar to that of silicon; therefore, the expansion and contraction of the heat sink mounting surface will be similar to that of the silicon substrate of the semiconductor chips. Since both elements, the heat sink mounting surface 165 and the chip substrates, expand and contract similar amounts during heating and cooling, the problems of delamination of the chip from the mounting surface 165 or of the chip substrate cracking and breaking due to thermal flexing when the component heats and cools is eliminated.

In order to be susceptible to receiving soldered components, as is a key element of the present invention, the molybdenum mounting surface 165 of the heat sink must be nickel-plated. Nickel plating of both sides of the mounting surface 165 not only allows silicon chips to be soldered with lead containing or lead-free solders to the external side of mounting surface 165, but also provides an improved bonding surface for the brazing process used to attach the porous metallic heat transfer media to the internal side of mounting surface 165 and to complete the assembly of the heat sink 16. Electrodeposited nickel plating is sufficient for the external mounting surface 165 on to which the electronic components are to be soldered. However, it has been found by the inventors that an electroless process is optimal to properly nickel plate the interior surfaces of the heat sink housing 161 prior to assembly of the heat sink 16 and concurrent attachment of the porous metallic media 24 to the internal surfaces of the heat sink housing 161 by brazing. When an electroless process is used for the interior of the housing 161, it is a simple matter to extend the process to the external side of the mounting surface 165 as well, thereby eliminating the electrodeposit process.

Although molybdenum is very difficult to nickel plate, the inventors have found that a suitable nickel plating can be produced on the mounting surface 165 by flash coating with an electrodeposit process. While this electrodeposit process may also be used to prepare the other surfaces of the components of the heat sink housing 161, it has been discovered by the inventors that the plating process for these surfaces is significantly improved by flash coating with an electroless process utilizing boron-nickel.

After flash coating a molybdenum body with an electroless boron-nickel, the plated components are heated to 1436–1472° F. for approximately one hour in a thermal diffusion process. The thermal diffusion process may be performed in either a hydrogen atmosphere or in a vacuum.

In the preferred embodiment of the present invention adapted for use with a power converter, the heat sink 16 is formed as a rectangular enclosure having external dimensions of approximately 0.5" thick by 2.5" wide by 5.0" long. It is envisioned by the inventors that various numbers, shapes and size of electronic components may be utilized, according to the requirements of specific applications, and the dimensions of the heat sink will vary accordingly.

For the preferred embodiment of the present invention, the porous metal heat transfer medium of the interior heat transfer element 24 is constructed by packing relatively small, uniformly sized metallic balls together in the interior of the heat sink housing 161. It has been found by the inventors that balls having a diameter between 0.05 and 0.15 inch are optimal. The balls must be bonded to each other and to the heat sink housing 161. The bond contact area must be sufficiently large to allow for conduction of heat and electricity from the mounting surface 165 into and throughout the porous metal heat transfer element 24. The metallurgical bonding between the balls is achieved by plating the balls with sufficient volume of a brazing compound so that during a brazing cycle a sufficient volume of liquid is produced to allow wetting at contact points between the balls. This increases the size of the conductive heat transfer paths and minimizes thermal and electrical resistance.

It should be clear that many different materials and shapes can be chosen for the individual heat transfer media of the internal element 24. However, in the preferred embodiment, a copper ball is used. Because copper alloys are susceptible to hydrogen embrittlement, the composition of the balls must be controlled to allow for the thermal processing required during the brazing process. In the preferred embodiment, an OFHC (Oxygen Free High Conductivity) copper alloy ball is utilized.

The alloy must be free of contaminants to be properly bonded in the brazing process. For this reason, the commercially available copper balls are first chemically milled to remove a significant amount of material from the surface of the balls. The degree of material removal necessary is defined by the condition of the balls as purchased.

A copper-silver eutectic brazing compound is used to bond the balls together. The eutectic copper-silver alloy is produced by first plating silver onto the copper balls, and then thermally processing the resultant matrix to achieve the proper amount of liquefaction. In the preferred embodiment, the balls are prepared by electrodepositing a 0.0005 to 0.0010 inch thick layer of dull silver onto the copper balls.

After the balls have been silver plated, they are introduced into the interior of the heat sink housing 161. The housing 161 is then secured in a brazing fixture. With an appropriate fixture, the brazing together of the individual balls of the porous metal heat transfer element and the sealing of the heat sink housing 161 can be performed concurrently. The following thermal cycling is used during the brazing process:

a) Heat to 1000±25° F. in 60 min.
 b) Hold at 1000±25° F. for 20 min.
 c) Heat to 1400±15° F. in 30 min.
 d) Hold at 1400±15° F. for 20 min.
 e) Heat to 1500±10° F. in 5 min.
 f) Hold at 1500±10° F. for 10 min.
 g) Furnace cool to 500° F.

The resultant heat sink is then ready for installation of the electronic components.

Because one surface of the heat sink 16 is used as a mounting surface for the component circuitry, that surface must be relatively flat, and will typically be formed from molybdenum. Occasionally during the brazing process, the bonding of the balls to the wall of the heat sink housing 161 causes excessive deformation of the wall. The amount of acceptable variance from flat will vary according to the specific application. If the brazing process takes the mounting surface 165 of the heat sink 16 outside acceptable tolerances, additional processing is required.

The flatness of the mounting surface 165 of the heat sink 16 can be restored by machining and re-plating the surface. It has also been discovered that flattening of the mounting surface 165 can be accomplished by a coining process. The coining process simply involves applying high pressure to the housing (a cold forming process) until the surface is brought within acceptable flatness limits.

Alternate Embodiments

Figure 9:
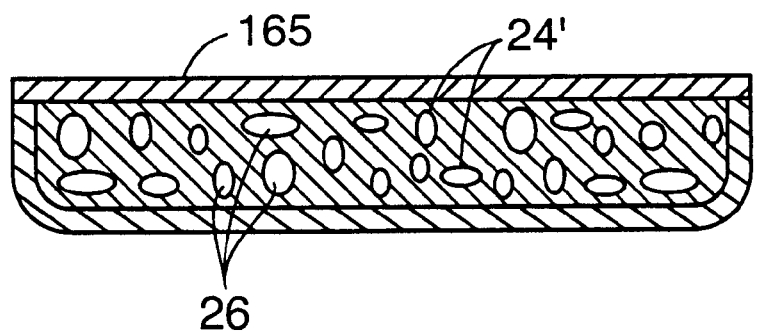
FIG. 9 is a sectional view of the heat sink with a first alternate embodiment of the internal element.
Figure 10:
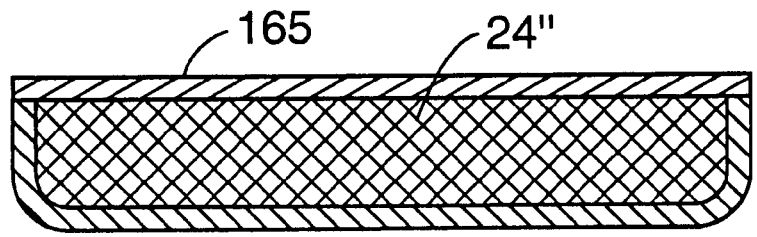
FIG. 10 is a sectional view of the heat sink with a second alternate embodiment of the heat sink.
Figure 11:
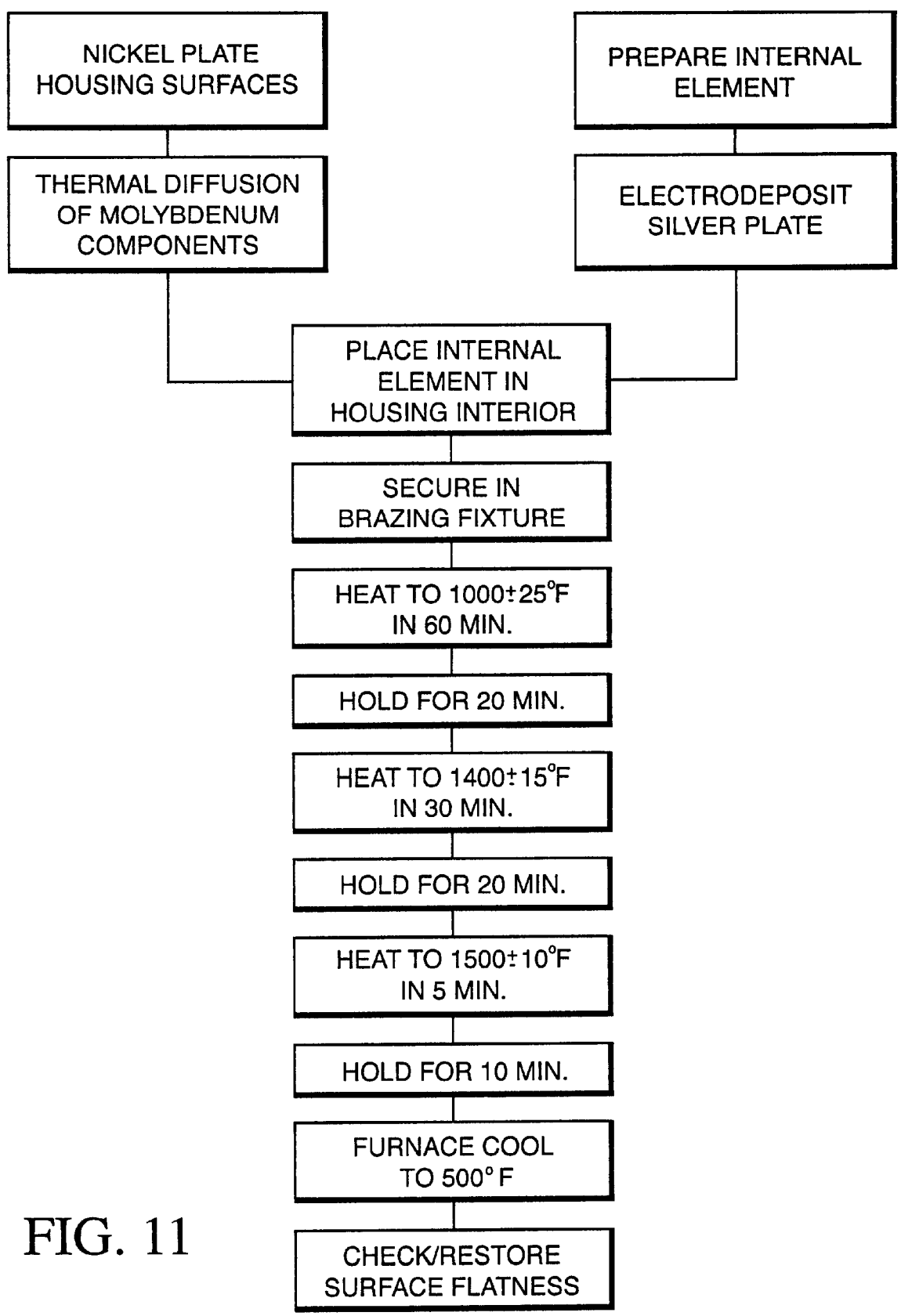
FIG. 11 is a schematic flow chart of the process of the present invention.

FIGS. 9 and 10 illustrate alternate embodiments of the method disclosed herein. The alternatives are the choice of materials and fabrication method used to manufacture the porous metallic heat transfer element 24. FIG. 9 illustrates a first alternate embodiment 24' that utilizes a metal foam, such as copper foam, or a metal block, such as a copper block, with a plurality of throughways or channels 26 machined therein.

FIG. 10 illustrates a second alternate embodiment configuration of the heat sink 24" that utilizes a metal fabric such as copper wool or copper felt. The processing of the heat sink I remains unchanged as the metal fabric has inherent throughways formed in the material.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

We claim:

1. A module for an electronic device comprising:

at least one semiconductor component and an electrical bus; wherein said semiconductor component is metallurgically attached to said electrical bus, said electrical bus is an electrically conductive heat sink for said semiconductor component, said heat sink comprising an enclosed housing with at least one throughway therein to allow passage of a heat transfer fluid through said heat sink, said electrically conductive heat sink that is said electrical bus has at least one surface formed from a material that is electrically and thermally conductive that is the mounting surface for said semiconductor component, said material having a coefficient of thermal expansion approximating that of a substrate of said semiconductor component, and said semiconductor component is attached directly to said mounting surface of said heat sink that is said electrical bus by a metallic material that melts to flow across and wet said surface of said heat sink and said semiconductor component, thereby bonding said semiconductor component to said heat sink so that said semiconductor component is electrically and thermally coupled to said heat sink.

2. The module of claim 1 wherein:

said metallic material used to attach said semiconductor component to said electrical bus has a volume electrical resistivity less than 50 micro-ohm cm at 23° C. and a thermal conductivity greater than 10 W/m·° K at 23° C.

3. The module of claim 1 wherein:

said metallic material is a solder.

4. The module of claim 3 wherein:

said solder comprises at least one metal of the class of tin, lead, antimony, indium, and silver.

5. The module of claim 1 wherein:

said semiconductor component is a power semiconductor.

6. The module of claim 5 wherein:

said power semiconductor is one of the class of semiconductors commonly known as diodes, thyristors, triacs, gate turn-off thyristors, metal oxide semiconductor controlled thyristors, transistors, bipolar junction transistors, metal oxide semiconductor controlled field effect transistors, and insulated gate bipolar transistors.

7. The module of claim 5 wherein:
said bus carries currents exceeding 100 Amps.
8. The module of claim 1 wherein:
said module is an element of a power conversion and control device adapted to convert AC power to DC power, to convert DC power to DC power of a different voltage, to convert DC power to AC power, or to convert AC power to AC power of a different frequency.
9. The power conversion and control device of claim 8 wherein:
said bus carries currents exceeding 100 Amps.
10. The module of claim 1 wherein:
said heat sink comprises a plurality of metallic spheres thermally and electrically connected to each other and to the interior surfaces of said heat sink housing, such that a spaced lattice structure is formed.
11. The module of claim 9 wherein:
said metallic spheres are silver plated copper balls.
12. The module of claim 1 wherein:
said heat sink comprises a pair of parallel channels, each said channel having an open portion on an upper inner side thereof, such that said heat transfer fluid fills said channels and spills into an interior of said heat sink means, thereby surrounding a heat transfer medium contained in an interior of said heat sink means.
13. The module of claim 1 wherein:
said heat sink comprises an internal element formed by machining a plurality of channels in a solid metallic element.
14. The module of claim 1 wherein:
said heat sink comprises an internal element formed from metal foam.
15. The module of claim 1 wherein:
said heat sink comprises an internal element formed from metal fibers.
16. The module of claim 1 wherein:
said heat sink housing is formed from materials having an electrical resistivity of less than 50 micro-ohm cm at 23° C. and a thermal conductivity greater than 100 W/m·° K at 23° C.
17. The module of claim 1 wherein:
a mounting surface of said heat sink has a coefficient of thermal expansion between 4.5 and 10 ppm/° K at 23° C.
18. The module of claim 17 wherein:
said mounting surface of said heat sink is made from molybdenum.
19. The module of claim 1 wherein:
said heat transfer fluid is a dielectric.
20. The module of claim 19 wherein said heat transfer fluid is the oil used to cool an electric traction motor.
21. The module of claim 1 wherein:
said heat sink is constructed with a flat elongated geometry.
22. The power conversion and control device of claim 8 wherein:
said heat sink means elements are aligned in two rows, each said row including three heat sink elements.
23. The power conversion and control device of claim 8 wherein:
each of said heat sink means elements in each said row is in communication with an adjacent heat sink means element, such that fluid can flow from a first heat sink means element in a row, through a second heat sink means element in said row, and through a third heat sink means element in said row.

* * * * *

UNITED STATES PATENT AND TRADEMARK OFFICE
CERTIFICATE OF CORRECTION

PATENT NO. : 6,678,182 B2
DATED : January 13, 2004
INVENTOR(S) : Craig Joseph et al.

Figure 2:
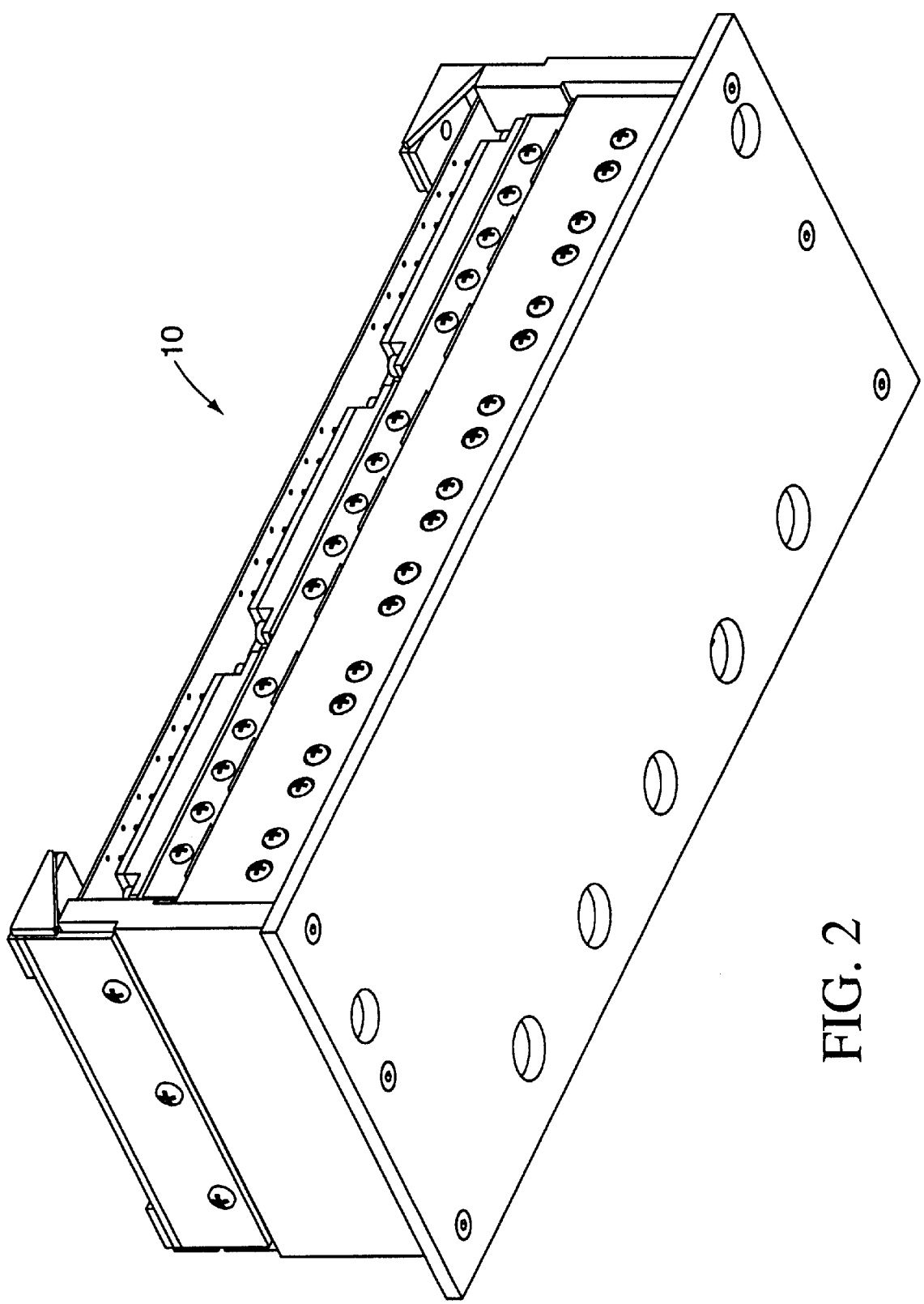
FIG. 2 a bottom side perspective view of the inverter shown in FIG. 1.
Figure 3:
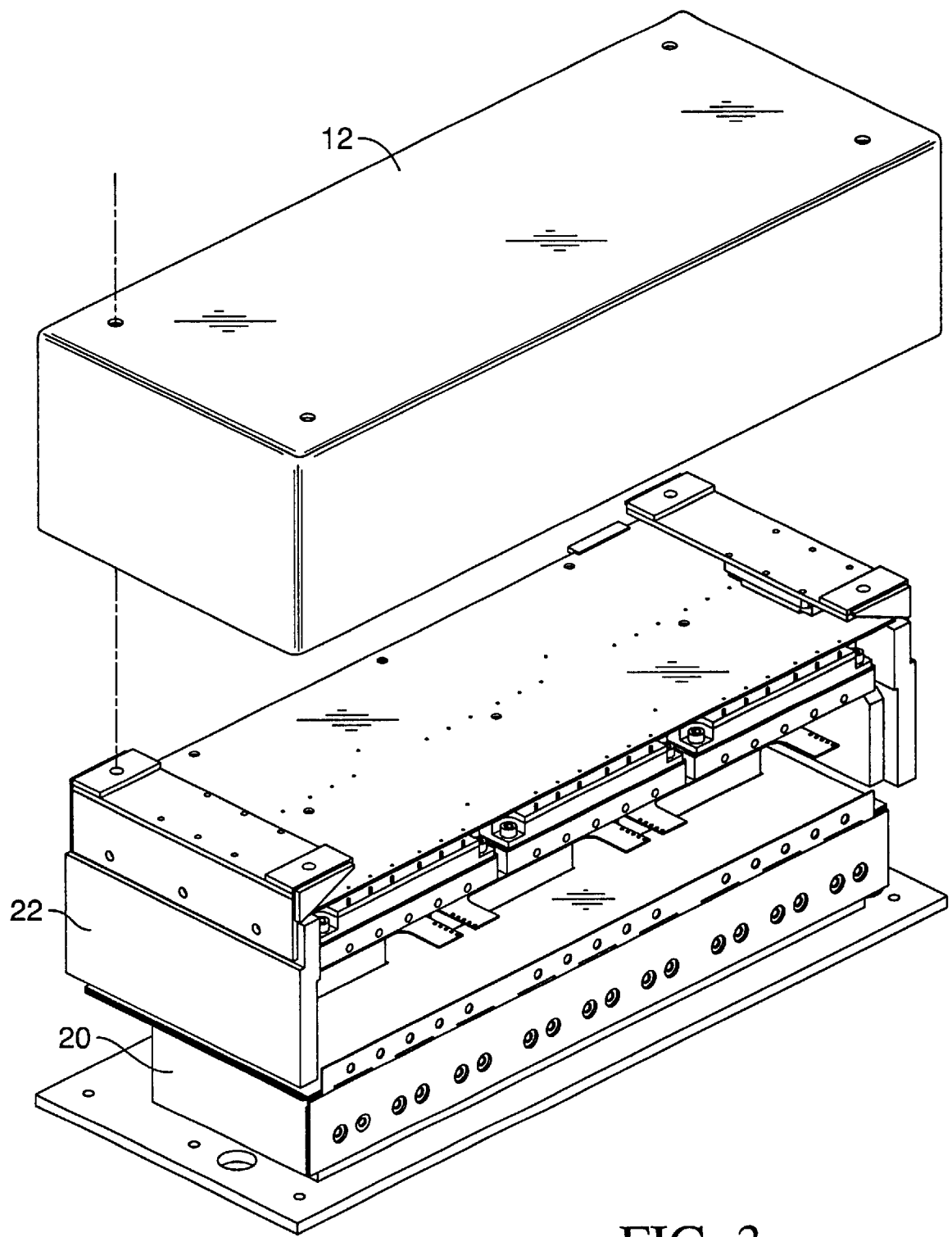
FIG. 3 is a top side perspective view of the inverter shown in FIG. 1 with a cover plate ready for assembly.
Figure 4:
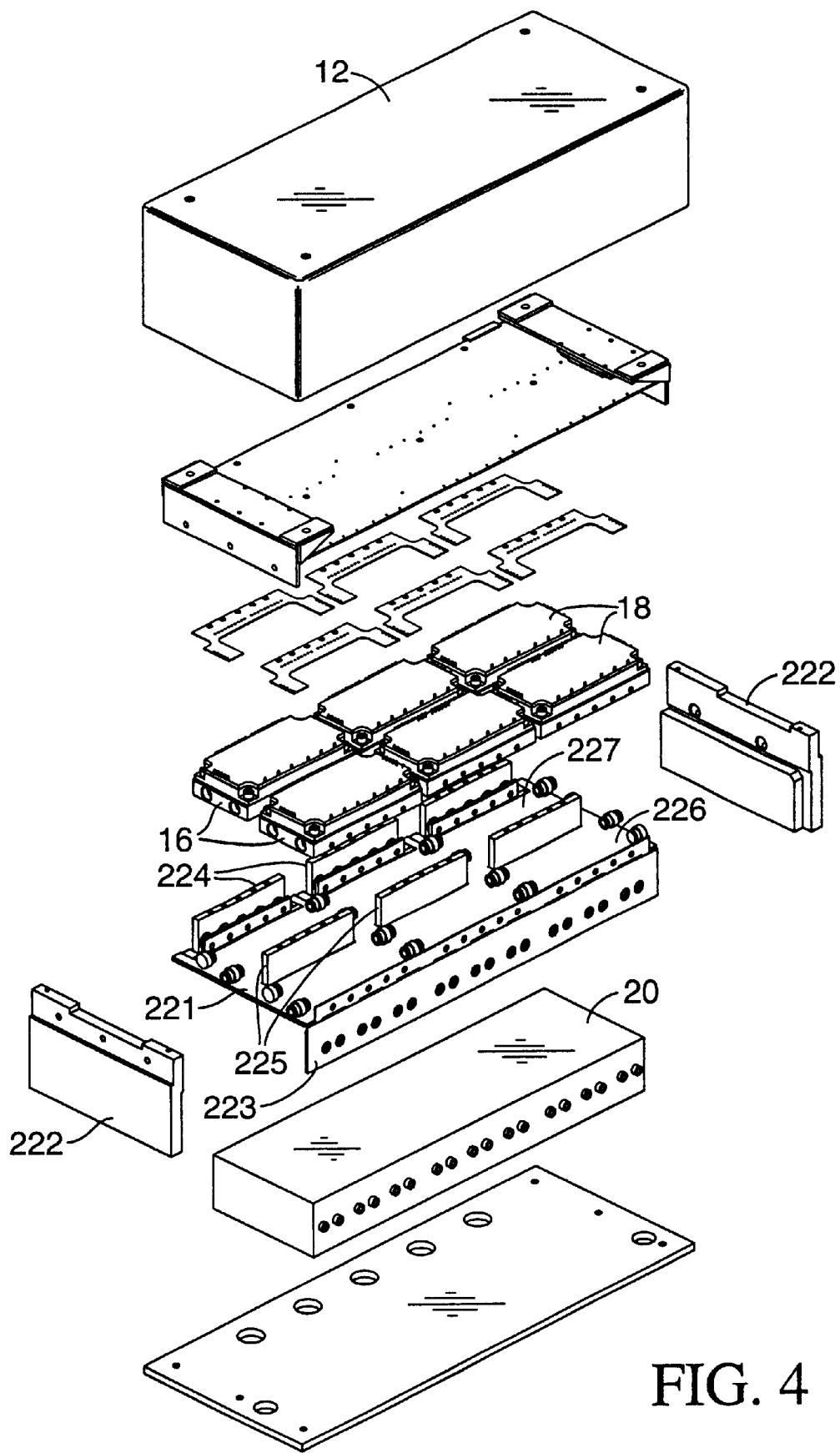
FIG. 4 is an exploded perspective view of the inverter shown in FIG. 1.

It is certified that error appears in the above-identified patent and that said Letters Patent is hereby corrected as shown below:

Column 6,
Line 25, insert -- is -- after "Fig. 2".

Column 7,
Line 21, delete "IGBT's" and insert -- IGBT --.

Column 12,
Line 13, delete "I" and insert -- 1 --.

Signed and Sealed this

Twenty-sixth Day of July, 2005

JON W. DUDAS
*Director of the United States Patent and Trademark Office*